United States Patent
Nechache et al.

(10) Patent No.: US 8,907,205 B2
(45) Date of Patent: Dec. 9, 2014

(54) COMBINED PN JUNCTION AND BULK PHOTOVOLTAIC DEVICE

(75) Inventors: Riad Nechache, Montreal (CA); Andreas Ruediger, Saint-Bruno de Montarville (CA); Federico Rosei, Montreal (CA)

(73) Assignee: Institut National de la Recherche Scientifique (INRS), Montreal (CA)

( * ) Notice: Subject to any disclaimer, the term of this patent is extended or adjusted under 35 U.S.C. 154(b) by 846 days.

(21) Appl. No.: 13/162,186

(22) Filed: Jun. 16, 2011

(65) Prior Publication Data

US 2012/0017976 A1     Jan. 26, 2012

Related U.S. Application Data

(60) Provisional application No. 61/356,236, filed on Jun. 18, 2010.

(51) Int. Cl.
- *H01L 31/078* (2012.01)
- *H01L 31/032* (2006.01)
- *H01L 31/052* (2014.01)

(52) U.S. Cl.
CPC .......... *H01L 31/0527* (2013.01); *H01L 31/078* (2013.01); *H01L 31/032* (2013.01); *Y02E 10/52* (2013.01)
USPC ............. 136/254; 136/255; 136/256; 438/85; 438/94; 438/95

(58) Field of Classification Search
USPC ................................ 136/243–265; 438/57–98
See application file for complete search history.

(56) References Cited

U.S. PATENT DOCUMENTS

| | | | |
|---|---|---|---|
| 4,055,442 A | 10/1977 | Crosher | |
| 4,365,106 A | 12/1982 | Pulvari | |
| 6,081,017 A | 6/2000 | Kim | |
| 6,639,143 B2 | 10/2003 | Kim et al. | |
| 7,696,549 B2 | 4/2010 | Ramesh | |
| 2010/0276003 A1* | 11/2010 | Kawano et al. | 136/261 |

FOREIGN PATENT DOCUMENTS

JP     2008-189947    *    8/2008

OTHER PUBLICATIONS

Dr. Felser, Multiferroics, Materials for Optical, Magnetic and Energy Technologies, Johannes Gutenberg University, (http://www.super-conductivity.de/content/139.html) (downloaded Aug. 21, 2014).*
M. A. Green, Progress in photovoltaics: Research and Applications 17, 183 (2009).
C. B. Honsberg, Design Strategies for commercial solar cells using the buried contact technology, IEEE Trans. on Electron devices, vol. 46. No. 10, (1999).
R. R. King, Multijunction cells: Record breakers. Nature Photon. 2, 284 (2008).

* cited by examiner

*Primary Examiner* — Jayne Mershon
(74) *Attorney, Agent, or Firm* — Goudreau Gage Dubuc; Gwendoline Bruneau

(57) ABSTRACT

A solar cell comprising a semiconductor solar cell of a first band gap; a buffer layer formed on a surface of the semiconductor solar cell; and at least one layer of a multiferroic or a ferroelectric material formed on the buffer layer; wherein the at least one layer of a multiferroic or a ferroelectric material has a second bang gap, the first band gap being smaller than the second band gap.

15 Claims, 2 Drawing Sheets

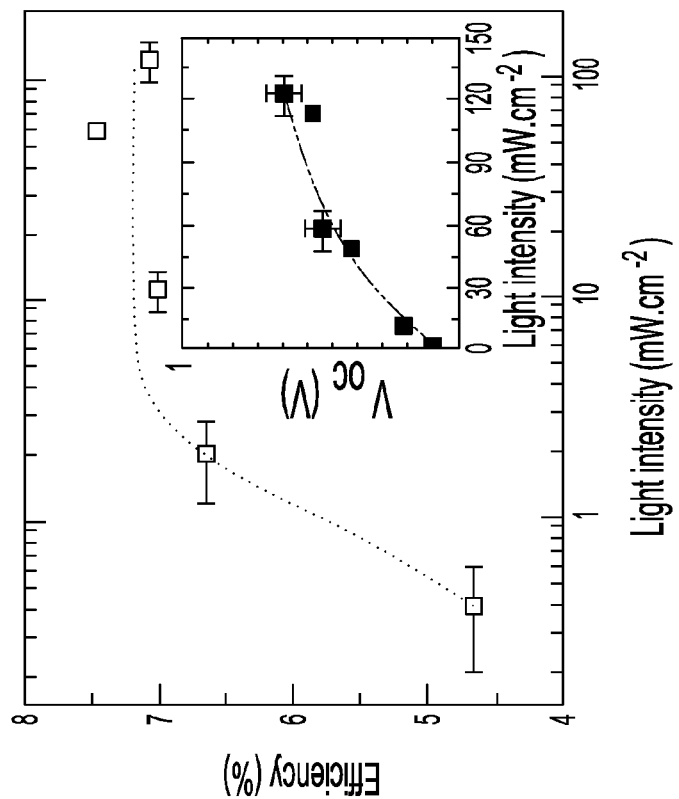
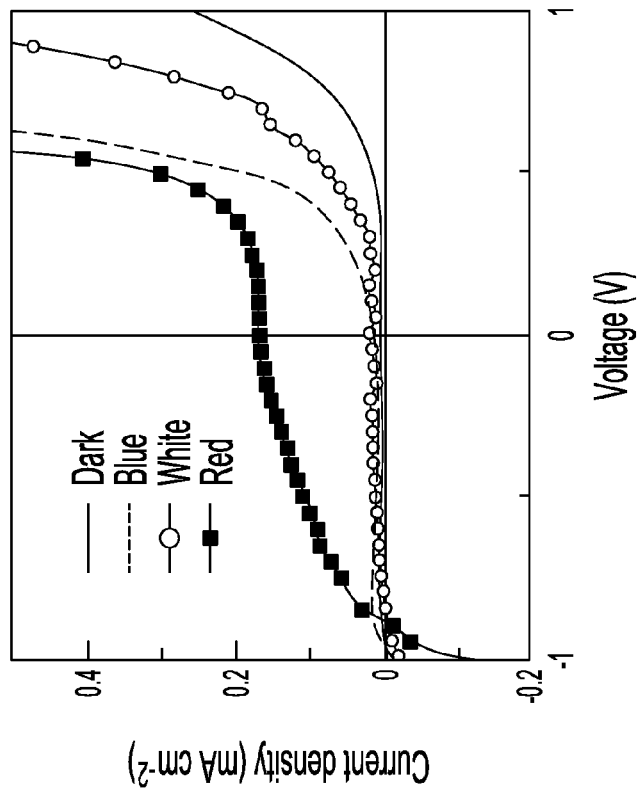
Fig-1B
Fig-1A

COMBINED PN JUNCTION AND BULK PHOTOVOLTAIC DEVICE

CROSS REFERENCE TO RELATED APPLICATIONS

This application claims benefit of U.S. provisional application Ser. No. 61/356,236, filed on Jun. 18, 2010. All documents above are incorporated herein in their entirety by reference.

FIELD OF THE INVENTION

The present invention relates to solar cells and, in particular, to improving the efficiency of a solar cell by using various properties of multiferroic materials.

BACKGROUND OF THE INVENTION

Pn or Schottky semiconductor junctions are at the basis of solar cells. Basically, when photons more energetic than the bandgap of the light absorbing semiconductor are absorbed by a junction, charge carriers, i.e. electrons and holes, are generated and separated by the internal electric field developed in the interfacial depletion zone. The limited charge transport through the p-n junction and the presence of energy barriers at the interfaces are factors affecting the power conversion efficiency of the current solar cells, i.e. the short-circuit photo-current density $J_{ph}$ and the open-circuit photo-voltage-$V_{OC}$).

Recently, power conversion efficiency of 25% has been reported for single-crystal silicon solar cells[i]. Unfortunately such performance is still related to a number of disadvantages, including for example high material costs, high energy payback times, lack of physical flexibility and additional complicated processing steps such as providing passivation layer, anti-reflection layer (AR),[ii] grooves, buried contact (BC) and back surface field (BSF), etc. This is the case of the double sided buried contact silicon solar cells (DSBC) that were developed to solve the problem of hole-electron recombination from rear aluminum-alloyed region observed, due to the thermal process at high temperature and for long times, in single sides buried contact (SSBC). The SSBC cells or buried contact silicon cells have been very successful in overcoming most fundamental limitations associated with the conventional screen-printed metallization scheme.[iii] In DSBC cells, however, a shunt path is needed between the back surface electrode and a floating junction layer to obtain the desired BSF effect. To solve this problem, a self-biased solar cell structure is introduced to reduce the hole-electron recombination at the rear surface area.[iv] However, this method involves additional processing steps for connecting the front electrode to the back electrode. Furthermore, since BSF is obtained by using voltage generated by the solar cell, its dimensions are limited to values smaller than the open-circuit voltage ($V_{OC}$).

Other structures based on ferroelectric films have been introduced to increase the efficiency of a single semiconductor solar cell.

Kim et al.[v] have suggested a method to achieve high efficiency in single semiconductor solar cells by using a ferroelectric material, by forming ferroelectric layers on the front and the rear surfaces of the semiconductor solar cell. The electric charge generated by the spontaneous polarization of these ferroelectric layers provides a surface passivation effect or a back surface field, depending on the position of the layers. Furthermore, with the deposited ferroelectric layers, the open-circuit voltage of the solar cell can be increased significantly while enhancing the energy efficiency of the single semiconductor solar cell.

Pulvari[vi] has proposed an efficient method based on a ferroelectric material for converting solar energy into electricity, by sandwiching, in the solar cell, a very thin film of ferroelectric insulator between a semiconductor and a metal electrode, thus forming a Metal-Insulator-Semiconductor (MIS) structure. In this case, the thermally induced electric charge produces an inversion layer used to make the desired pn junction.

In all techniques, however, loss by interfacial recombination of holes and electrons is increased due to the formation of a heterojunction at the semiconductor-ferroelectric material interface. Furthermore, the electrons mobility is limited due to the insulating effect and large band gap of the ferroelectric materials, which in turns results in lowering the efficiency of the cell.

The photovoltaic effect observed in ferroelectric perovskite thin films has recently attracted attention due to its potential applications in the area of optoelectronic devices and optical information storage. In contrast to the conventional junction-based interfacial photovoltaic effect in semiconductors (i.e. p-n or Schottky junctions), the photovoltaic effect in ferroelectrics is essentially a bulk effect: the photo-generated charge carriers of both polarities are driven by the polarization-induced internal electric field in opposite directions towards the cathode and the anode, respectively, and contribute to the photovoltaic output. Increased photovoltaic power conversion efficiency for ferroelectric thin films (around 0.28%) has been recently achieved with devices based on epitaxial La-doped lead zirconate titanate (PZT) films[D], although the efficiency of this material remains limited by its large band gap. The availability of lower band gap multiferroic oxides such as $BiFeO_3$ (BFO) and $Bi_2FeCrO_6$ (BFCO)[E, F] provides alternative materials to achieve a higher photovoltaic efficiency.

There is still a need in the art for high efficient solar cells involving simplified components structure and using simplified processing steps.

SUMMARY OF THE INVENTION

More specifically, there is provided an heterostructure comprising a semiconductor solar cell of a first band gap; a buffer layer formed on a front surface of the semiconductor solar cell; and at least one layer of a multiferroic or a ferroelectric material formed on the buffer layer; wherein the at least one layer of a multiferroic or a ferroelectric material has a second bang gap, the first band gap being smaller than said second band gap.

There is further provided a solar cell comprising a semiconductor solar cell of a first band gap; a buffer layer formed on a surface of the semiconductor solar cell; and at least one layer of a multiferroic or a ferroelectric material formed on the buffer layer; wherein the at least one layer of a multiferroic or a ferroelectric material has a second bang gap, the first band gap being smaller than the second band gap.

There is further provided a method for manufacturing a solar sell, comprising providing a semiconductor solar cell of a first band gap; forming a buffer layer on a surface of the semiconductor solar cell; and forming at least one layer of a multiferroic or a ferroelectric material on the buffer layer; wherein the at least one layer of a multiferroic or a ferroelectric material has a second bang gap, the first band gap being smaller than the second band gap.

Other objects, advantages and features of the present invention will become more apparent upon reading of the following non-restrictive description of specific embodiments thereof, given by way of example only with reference to the accompanying drawings.

BRIEF DESCRIPTION OF THE DRAWINGS

In the appended drawings:

FIG. 1 show the photovoltaic responses for Tin-doped indium oxide (ITO)/BFCO/Nb-doped $SrTiO_3$(001) heterostructure: (a) J-V characteristics measured with incident light of 635 nm (red), 410 nm (blue) and white light (mercury lamp); (b) power conversion efficiency as a function of red light Intensity; Insert of (b) Open-circuit voltage, Voc as a function of light intensity.

DESCRIPTION OF EMBODIMENTS OF THE INVENTION

Figure 2:
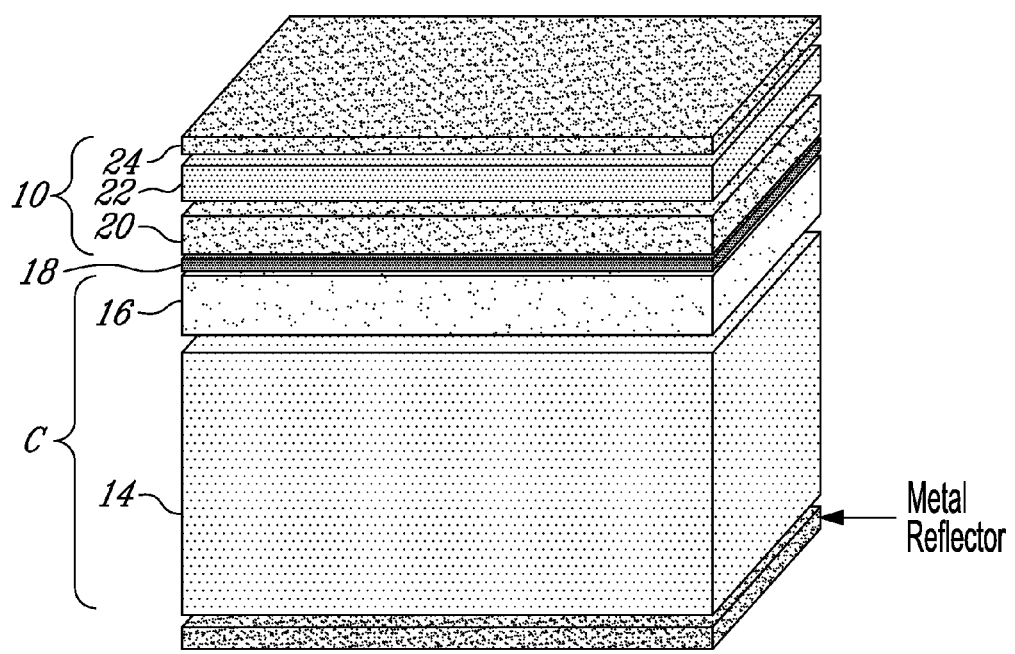
FIG. 2 is a schematical view of an heterostructure according to an embodiment of an aspect of the present invention.

In a nutshell, there is provided a method and a system to increase the efficiency of commercially available semiconductor solar cells by using simplified structural components as well as simplified processing steps.

There is described a method and a system allowing enhancing the photovoltaic efficiency of single semiconductor solar cells by making use of various properties of functional and multiferroic or ferroelectric materials.

According to an embodiment of an aspect of the present invention, multiferroic materials with good carrier transport properties and good visible light absorption extending into the red range are added to the base solar cell, providing a conductive, electron transparent buffer layer of a perovskite structure. They are selected with a small optical gap, i.e. in a range below about 3 eV. The resulting structure of the cells has good solar cells properties, including passivation and anti-reflecting layer and back surface field, and shows significant overall energy conversion efficiency.

Ferroelectric materials could also be used, added to the base solar cell on top of a conductive, electron transparent buffer layer of a perovskite structure. They are selected with a band gap below 3 eV and a crystal structure based on perovskite one and crystal cell parameters allowing epitaxial growth, such as, for example $Bi_4Ti_3O_{12}$, $Bi_6Ti_4O_{17}$ and $KTa_{0.5}Nb_{0.5}O_3$ The present method and system provide a high efficiency solar cell involving at least one multiferroic or ferroelectric material layer, of a band gap larger than the band gap of the base solar cell. In the case of more than one multiferroic or ferroelectric material layer, each upper layer is selected with an increasing band gap.

For example, a new multiferroic material known as $Bi_2FeCrO_6$ (BFCO) may be used as the first layer of the multiferroic heterostructure. It has been discovered that BFCO has surprising photovoltaic properties and a small optical band gap. FIG. 1a shows the current density versus voltage (J-V) curves for a 120 nm-thick epitaxial BFCO film measured in the dark and under different irradiations: red light with λ=635 nm, blue with λ=410 nm and white (mercury lamp). The measurements show a diode-like behavior characterized by a directional leakage at positive voltage. In all cases, photovoltaic effect was observed in J-V curves taken under these illuminations. The open circuit photovoltage $V_{OC}$ and the short circuit photocurrent $J_{ph}$ were 0.63V and 0.13 mA.cm$^{-2}$, 0.71V and 0.03 mA.cm$^{-2}$, 0.55V and 0.009 mA.cm$^{-2}$ under red, blue and white illumination respectively. The maximum external power conversion efficiency was calculated to be η about 8% at a fill factor of about 0.68. These surprising properties are thus used to improve the energy efficiency of a conventional semiconductor solar cell. $J_{ph}$ is observed to increase almost linearly with the illumination intensity (FIG. 1b), while $V_{oc}$ saturates at high illumination intensity (Insert of FIG. 1b).

Ordered BFCO thin films can be obtained artificially by depositing alternatively $BiFeO_3$ and $BiCrO_3$ materials on (111) oriented single perovskite substrates.

A number of multiferroic materials could be used, including materials based on the ferroelectric-magnetic double perovskite structure, such as $Bi_2FeNiO_6$, $Bi_2FeTiO_6$, $Bi_2FeMnO_6$, $Bi_2NiReO_6$, $Bi_2MnReO_6$ and $Bi_2CoMnO_6$ for example.

Thus, multiferroic layers may be carefully superimposed on a base solar cell, to improve the separation process and transportation of the photogenerated carriers through the resulting cell, since the multiferroic materials exhibit a good bulk-photovoltaic effect which additionally contributes to the photocurrent and the photovoltage of the resulting cell.

In an example illustrated in FIG. 2, the base solar cell (C) has a pn structure with a semiconductor substrate of a first conductive type (p or n) 14, a semiconductor layer 16 of a second conductive type (n or p) formed on the first conductive substrate 14, and a pn junction formed at the interface between the first conductive type semiconductor substrate 14 and the second conductive type semiconductor layer 16. The first 14 and the second 16 conductive type have opposite polarities.

A buffer layer 18 is formed on the front surface of the second conductive type semiconductor layer 16. The buffer layer 18 is a doped film, such as N-doped $SrTiO_3$ or Nb-doped $SrTiO_3$, of a thickness selected so as to allow the tunneling mechanism. Since this tunneling effect changes from coherent below 1.5 nm to incoherent (variable range hopping) for thicker films, the thickness of the buffer layer 18 is selected between about 2 and about 5 nm. For the buffer layer 18 to allow creating the epitaxy between the base solar cell and the heterostructure 10, it is selected so that a maximum lattice mismatch in relation to the material of the base solar cell and to the material of the first layer deposited upon the buffer layer is of about 7%. The buffer layer 18 will be discussed in more details herein below, in relation to the transportation of electrons between the bottom solar cell surface and the first deposited multiferroic layer.

The heterostructure 10 comprises a small bandgap (for example between 1.3-2.0 eV) multiferroic layer 20 formed on the buffer layer 18. The small bandgap multiferroic layer 20 is shown here as a thin film of $Bi_2FeCrO_6$ grown by pulsed laser deposition on the buffer layer 18, shown here as a (100)-oriented Nb-doped $SrTiO_3$.

In this example, the heterostructure 10 further comprises a larger bandgap (for example higher than 2.5 eV) multiferroic layer 22, such as for example $Bi_2Fe_2O_6$ or $BiFeO_3$, superimposed on the small bandgap multiferroic layer 20.

A transparent electrode 24 is formed on at least a part of the larger bandgap multiferroic layer 22. The transparent electrode 24 placed at the top of the multiferroic heterostructure 10 comprises a transparent conductive oxide material (TCO), such as ITO (Indium tin oxide), $RuO_2$, $SrRuO_3$, $IrO_2$ or $La_{1-x}Sr_xCoO_3$ for example.

High crystal quality of the multiferroic heterostructure and layers could be also grown by methods usually applicable for other complex perovskite oxides, such as metal organic chemical vapor deposition (MOCVD), vapor-phase epitaxy (VPE), a modification of chemical vapor deposition, Plasma-enhanced chemical vapor deposition (PECVD), molecular beam liquid-phase epitaxy (MBE and LPE), Atomic layer deposition (ALD) and sputtering for example.

The operational effect of the multiferroic heterostructure 10 positioned at the front surface of a solar cell will now be explained in detail in relation to FIG. 2. The upper larger bandgap multiferroic layer 22 absorbs higher-energy photons, and provides a correspondingly large open-circuit voltage; the low bang gap multiferroic layer 20 beneath absorbs lower-energy photons and provides additive contribution to the open-circuit voltage. Finally, all the photons not absorbed by the preceding layers are received by the conventional base solar cell (C), made of silicon for example, which has the smallest bandgap, for example 1.1 eV for the indirect bandgap of silicon.

The multiferroic materials used in the heterostructure 10 grown on the solar cell (C) are selected to have a similar crystal structure, i.e. a low mismatch lattice constant (for example less than 3%), so as to yield optical transparency and maximum current conductivity between the top and bottom layers. The lattice mismatch limits the maximum thickness of the layer prior to the onset of misfit dislocations. 7% may be considered an upper limit, as it will limit the thickness and the number of possible techniques for deposition.

As a large mismatch in the crystal lattice may produce crystallographic defects such as misfit dislocations and potentially constitute a source for electron-hole recombinations, multiferroic materials with different bandgaps and closer lattice constants are selected, such as, for example, $BiFeO_3$ (a=3.96 Amg.) $Bi_2FeCrO_6$ (a=3.94 Amg.) and, the buffer layer may be $SrTiO_3$ (a=3.90 Amg). This tunnel oxide junction is used as a buffer layer to promote epitaxial growth and high crystal quality of the deposited multiferroic heterostructure[vii]. The epitaxial strain avoids the nucleation of crystal defects which constitute traps for holes and electrons; thus epitaxial strain improves the charge transport through the layers.

In particular, epitaxial growth of the multiferroic heterostructure allows forming a self polarized layer having a majority of the ferroelectric domains oriented in a same direction, i.e. a unidirectional spontaneous polarization, perpendicular to the solar cell surface. As a result, deposition of a polarized electrode and use of part of the cell's generated photovoltage for polarizing the multiferroic materials are not necessary, in contrast to known solar cells using ferroelectric material[Erreur ! Signet non défini.].

As in the multi-junction solar cells[viii], the thickness of each respective multiferroic layer is carefully selected. As the layers are stacked in series, it is important they each provide a same amount of current. The current produced by a layer is directly proportional to the number of absorbed photons. Since the materials used for each layer have different photon absorption constants, these differences are compensated by different thicknesses. This means a material with a low absorption constant will be used for a thicker layer in the solar cell, so that each layer produces the same amount of current.

Interestingly, the epitaxial strain, which results from lattice mismatch, between the buffer layer, such as $SrTiO_3$ for example, and the BFCO layer for example, can be used to modulate the optical gap of the BFCO material. Indeed, the strain directly affects the structural parameters of BFCO (e.g. the bond distances, angles and Fe/Cr cation ordering) and causes a modification of the high hybridizing energy effect between Fe, Cr and O on the density of states distribution in the BFCO film. The strain gradient usually present in epitaxial perovskite thin films can be advantageously used here to design a desired gap gradient in the same layer.

As people in the art will appreciate, the present system and method provide a number of advantages. As well known in the art, in traditional single semiconductor solar cells most of the incident solar energy is not converted into electricity, since when an incident photon has less energy than the band gap, it is not absorbed and passes through, and when an incident photon has more energy than the band gap, it is absorbed with the excess energy becoming heat, since the electron can only absorb the band gap energy. A multiferroic film or a ferroelectric grown on the front surface of the solar cell according to the present invention allows absorbing the high photon energy, thereby minimizing this thermal effect and allowing a more efficient photo-generation process.

Solar cells using multiferroic or ferroelectric materials as taught by the present invention have an improved photogenerated carrier separation process, in particular for those carriers generated in the solar cell. In addition to this self contribution to photovoltaic properties of the overall solar cell, a multiferroic or a ferroelectric layer formed on the top of the conventional cell generates an internal electric field at the near surface of the semiconductor, through the tunnel junction, by way of its spontaneous polarization. Therefore, electron-hole pairs are separated from each other and their recombination is prevented, and a surface passivation effect is obtained due to the formation of a front surface field.

A multiferroic or a ferroelectric layer as used according to the present invention may further play the role of controlling the reflection of sunlight, depending upon variation of the thickness thereof. For example, a thin multiferroic layer on the top of the cell can play the role of an anti-reflection layer and reduce the light reflection at the front of the cell, while a thicker multiferroic film deposited onto the rear of the solar cell may act as a rear surface reflection (Back Surface Reflection) for reflecting the light not absorbed in the semiconductor back into the cell. In addition to enhancing the energy efficiency of the solar cell, the deposition of an additional anti-reflection layer (AR) or an Al-based layer (forming the rear surface filed) may thus be omitted, which simplifies the process steps currently used for producing solar cells such as Double Side Buried Contact Silicon Solar cells-DSBC for example.

The observed photovoltaic effect in the BFCO films could be useful as the current source for micro-electro-mechanical systems (MEMS). Optical sensors are promising applications in the field of MEMS. Until now, only semiconductors have been used but they have the disadvantage of requiring the application of bias voltage at the semiconductor p-n junction interface. In the case of BFCO thin films the zero-biais photocurrent is larger and thus is useful and applicable to MEMS.

Although the present invention has been described hereinabove by way of embodiments thereof, it may be modified, without departing from the nature and teachings of the subject invention as defined in the appended claims.

REFERENCE

[i] M. A. Green, Progress in photovoltaics: Research and Applications 17, 183 (2009).
[ii] F. K. Crosher, U.S. Pat. No. 4,055,442 (1977).
[iii] C. B. Honsberg, Design Strategies for commercial solar cells using the buried contact technology, IEEE Trans. on Electron devices, vol. 46. no. 10, (1999).
[iv] D.-S. Kim, U.S. Pat. No. 6,081,017 (2000).
[v] J. Kim et al., U.S. Pat. No. 6,639,143 B2 (2003).
[vi] C. F. Pulvari, U.S. Pat. No. 4,3565,106 (1982).
[vii] R. Ramesh, U.S. Pat. No. 7,696,549 (2005).

[viii] R. R. King, Multijunction cells: Record breakers. Nature Photon. 2, 284 (2008).

The invention claimed is:

1. An heterostructure, comprising:
a semiconductor solar cell of a first band gap;
a buffer layer formed on a front surface of said semiconductor solar cell; and
a first layer of a multiferroic material formed on said buffer layer;
wherein said first layer of a multiferroic material has a second band gap, said first band gap being smaller than said second band gap.

2. The heterostructure of claim 1, further comprising a second layer of a multiferroic material, each layer having a band gap of an increasing value starting from said first layer formed on said buffer layer.

3. The heterostructure of claim 1, further comprising at least one layer of a ferroelectric material, each one of said layer of ferroelectric material and said first layer of multiferroic material having a band gap of an increasing value starting from said first layer formed on said buffer layer.

4. The heterostructure of claim 1, further comprising at least a second layer of multiferroic materials, said multiferroic materials having a lattice mismatch of at most 7%, each layer having a thickness selected according to its absorption constant.

5. The heterostructure of claim 1, wherein said buffer layer is a conductive, electron transparent buffer layer of a perovskite structure layer.

6. The heterostructure of claim 1, wherein said buffer layer is a layer of doped-$SrTiO_3$, and said first layer of a multiferroic material comprises a BFCO layer formed on said buffer layer, and a BFO layer formed on said BFCO layer.

7. The heterostructure of claim 1, wherein said first layer is a BFCO layer.

8. The heterostructure of claim 1, wherein said buffer layer is one of i) a N-doped $SrTiO_3$ (p-type); ii) a Nb-doped $SrTiO_3$ (n-type) layer; and iii) a superimposition of both.

9. The heterostructure of claim 1, wherein said buffer layer has a thickness comprised in a range between about 2 nm and about 5 nm.

10. The heterostructure of claim 1, further comprising a transparent electrode placed on top of said first layer of a multiferroic material.

11. The heterostructure of claim 1, further comprising a transparent electrode placed on top of said first layer of a multiferroic material, said transparent electrode being in one of ITO, $RuO_2$, $SrRuO_3$, $IrO_2$ and $La_{1-x}Sr_xCoO_3$.

12. The heterostructure of claim 1, wherein said first layer is grown by one of pulse laser deposition, organic chemical vapor deposition, vapor-phase epitaxy, chemical vapor deposition, plasma-enhanced chemical vapor deposition, molecular beam liquid-phase epitaxy, atomic layer deposition and sputtering.

13. A solar cell, comprising:
a semiconductor solar cell of a first band gap;
a buffer layer formed on a surface of said semiconductor solar cell; and
a first layer of a multiferroic material formed on said buffer layer;
wherein said a first layer of a multiferroic material has a second band gap, said first band gap being smaller than said second band gap.

14. A method for manufacturing a solar sell, comprising:
providing a semiconductor solar cell of a first band gap;
forming a buffer layer on a surface of the semiconductor solar cell; and
forming a first layer of a multiferroic material on the buffer layer;
wherein the first layer of a multiferroic material has a second band gap, the first band gap being smaller than the second band gap.

15. The heterostructure of claim 1, wherein said buffer layer is a layer of doped-$SrTiO_3$, and said first layer of a multiferroic material comprises a BFCO layer formed on said buffer layer.

* * * * *